(12) United States Patent
Galyon et al.

(10) Patent No.: US 6,173,759 B1
(45) Date of Patent: *Jan. 16, 2001

(54) METHOD OF COOLING ELECTRONIC DEVICES USING A TUBE IN PLATE HEAT SINK

(75) Inventors: George Tipton Galyon, Fishkill; Randall Gail Kemink; Roger Ray Schmidt, both of Poughkeepsie, all of NY (US)

(73) Assignee: International Business Machines Corporation, Armonk, NY (US)

( * ) Notice: Under 35 U.S.C. 154(b), the term of this patent shall be extended for 0 days.

This patent is subject to a terminal disclaimer.

(21) Appl. No.: 09/080,507

(22) Filed: May 18, 1998

Related U.S. Application Data

(62) Division of application No. 08/660,248, filed on Jun. 7, 1996.

(51) Int. Cl.$^7$ ........................................................ H05K 7/20
(52) U.S. Cl. ........................ 165/80.4; 165/168; 165/146; 361/699; 361/719
(58) Field of Search .................................. 165/80.4, 146, 165/168, 171; 361/699, 702, 716, 719–721

(56) References Cited

U.S. PATENT DOCUMENTS

| | | |
|---|---|---|
| 2,271,648 | 2/1942 | Kleist . |
| 4,155,402 | 5/1979 | Just . |
| 4,720,981 | 1/1988 | Helt et al. . |
| 4,744,008 | 5/1988 | Black et al. . |
| 4,747,450 | 5/1988 | Ikegame et al. . |
| 4,788,767 | 12/1988 | Desai et al. . |
| 4,884,168 | 11/1989 | August et al. . |
| 5,012,860 | 5/1991 | Mukherjee . |
| 5,088,005 | 2/1992 | Ciaccio . |
| 5,153,815 | 10/1992 | Suzuki et al. . |
| 5,208,733 | 5/1993 | Besanger . |
| 5,245,508 | 9/1993 | Mizzi . |
| 5,255,738 | 10/1993 | Przilas . |
| 5,353,192 | 10/1994 | Nordin . |
| 5,386,341 | 1/1995 | Olson et al. . |
| 5,394,936 | 3/1995 | Budelman . |
| 5,829,516 | * 11/1998 | Lavochkin ........................ 165/80.4 |

FOREIGN PATENT DOCUMENTS

| | | |
|---|---|---|
| 60-220954 | 11/1985 | (JP) . |
| 3-30399 | 2/1991 | (JP) . |
| 3-70197 | 3/1991 | (JP) . |
| 5-102356 | 4/1993 | (JP) . |
| 5-327251 | 12/1993 | (JP) . |

* cited by examiner

*Primary Examiner*—Allen Flanigan
(74) *Attorney, Agent, or Firm*—Lily Neff

(57) ABSTRACT

A method of cooling electronic devices in an electronic assembly is proposed where the said assembly has at least one board that houses electronic modules. The methodology comprises shaping a light weight plate with apertures as to compliment the geometric shape of the assembly and board to be cooled; affixing coolant passage tubes in the apertures of the plate and finally cooling the electronic assembly by placing the assembly in thermal contact with the plate and passage tubes after a coolant is introduced in the passages.

6 Claims, 3 Drawing Sheets

METHOD OF COOLING ELECTRONIC DEVICES USING A TUBE IN PLATE HEAT SINK

This application is a divisional application of Ser. No. 08/660,248 filed Jun. 7, 1996.

FIELD OF THE INVENTION

This invention relates to a method of heat removal from an electronic device, and more particularly to an improved method of water cooling an integrated circuit board in a semiconductor package.

BACKGROUND OF THE INVENTION

As integrated circuits become more complex, the circuit density of the chips increases. As this density increases, the thermal properties of a circuit package becomes a more important concern. The ability to remove heat generated from the high-powered and highly dense integrated circuits in a semi-conductor packaging becomes vital to the maintenance of the computer performance. The traditional method for cooling electrical devices has been through the use of air convection, a method operating on the idea of dissipating heat through the outer surfaces of the device and ultimately cooling it through the use of an airflow, usually driven by a fan. However, as the density and integration level of the integrated circuits along with the power requirements and the operating speed of the device all increase, the amount of heat dissipated by the system can no longer be adequately removed through the use of conventional air convection techniques. Even in cases where an adequate heat sink can be designed for removing the amount of dissipated heat, the physical size of this heat sink, which is of particular concern for compact devices such as laptop computers, becomes prohibitive.

The heat removal problem is further compounded by the geometry of the circuit board and its modules. Often an array of electronic modules are mounted on a flat printed circuit board. The modules may be of different shapes and geometry and therefore the height of a particular module can be much higher or lower than that of its neighbors.

Two problems occur with this kind of module configuration. First the module powers may be too high to be cooled by air cooling techniques along with other reasons described earlier. Therefore, the power levels dictate that liquid cooling should be used. Further, the second level packaging dictates a set of geometric constraints on the solution limiting the space available for cooling. In some cases, printed circuit cards plug radially into a horizontally located mother board. Thus, those components near the center of the second level package are afforded less space for cooling hardware than those at the outer radii. Light weight, low cost, material compatibility and no coolant leaks are other application requirements, especially when the preferred coolant is water.

SUMMARY OF THE INVENTION

Accordingly, an object of the present invention is to provide a method of cooling for electronic devices able to accommodate a variety of geometric constraints.

Another object of the present invention is to provide a method of uniform cooling for electronic modules accommodating the cooling of all components regardless of their location on an integrated circuit board.

Yet another object of the present invention is provide for a light weight, low cost solution to the problem of cooling electronic devices.

A further object of the present invention is to provide for a method of cooling for electronic devices that takes into account the problem of module's material compatibility.

Yet a further object of the present invention is to provide a leak free method of cooling electronic devices using liquids for such cooling.

Yet another object of the present invention is to provide a method of cooling electronic devices that can cool the electronic device independent of the orientation or the position of the device.

To achieve the above-mentioned objects, a method for cooling electronic devices in an electronic assembly is proposed where the said assembly has at least one board that houses electronic modules. The methodology comprises shaping a light weight plate as to compliment the geometric shape of the modules mounted on the printed circuit card to be cooled; shaping the plate further so that there is a shape transformation from top surfaces of the modules to said coolant passage tubes (also hereinafter referred to as coolant passages for simplicity), making holes or apertures in the plate in selective cooling locations as to provide better cooling to sensitive electronic areas; and finally cooling the electronic assembly through by bringing the assembly in thermal contact with the plate and passage tubes after a coolant is provided in the passages. According to one embodiment of the present invention, the coolant passage tubes and the plate are made out of different materials, with the coolant passage tubes being generally better heat dissipators than the plate.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 6A:
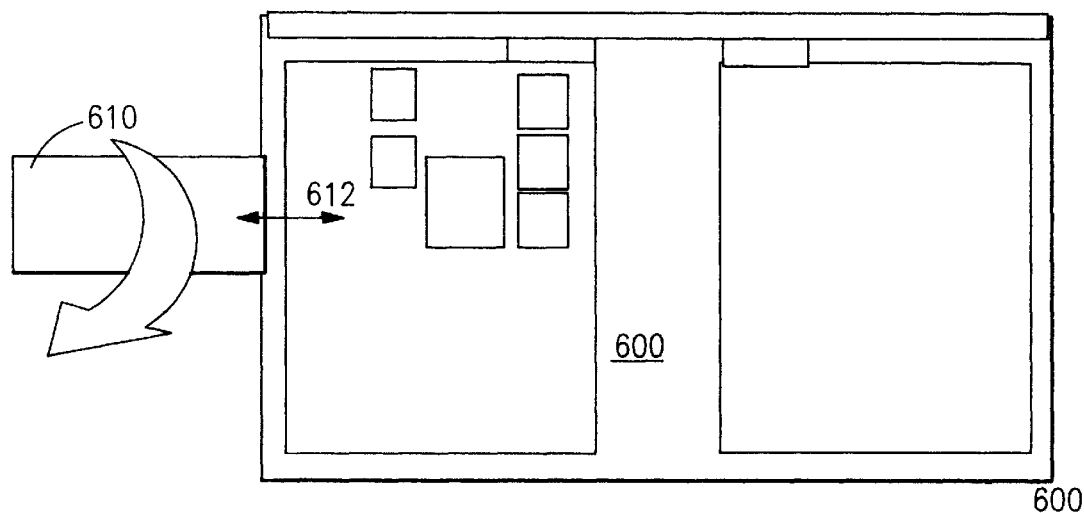
FIG. 6A is an illustration of a device according to one embodiment of present invention mounted in a test head and FIG. 6B is a detailed illustration of the embodiment shown in FIG. 6A.
Figure 6B:
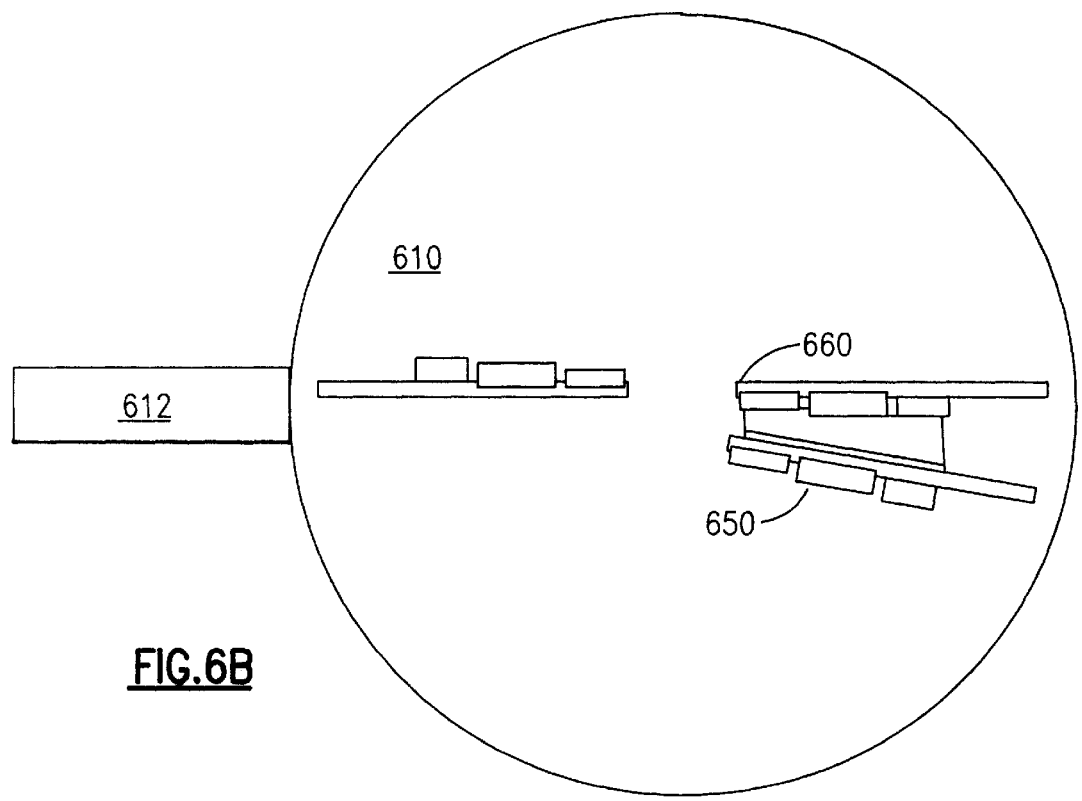

FIG. 6B illustrates an array of electronic modules mounted on a flat printed circuit. A plurality of modules of different heights and shapes are mounted on the board surface. When the module powers are sufficiently low, a conventional air cooling system can be used to solve the thermal problem caused by the heat dissipated by the modules. However, when the module powers are high, an air cooling arrangement is no longer sufficient in resolving the problem. With high module powers, the power levels dictate that some form of liquid cooling be utilized.

Several cooling approaches have been used in the past including: a) using a single internally finned cold plate; b) using forced convection methods utilizing florinerts such as FC-77, where the florinert is pumped over and around the electronic components to carry away dissipated heat; c) using individual water cooled cold plates on each component with the cold plates being connected in series or parallel with a flexible tubing such as a rubber hose of tygon tube; and d) using individual water cooled spreader plates provided on each component with the spreader plates being linked by a single copper tubing through which water flows serially from one spreader plate to the next.

However, each of the cooling methods as described did not adequately resolve the challenges presented by different module geometry and orientation placement of the modules on the board as the board became incorporated in another electronic assembly.

A single internally finned cold plate would have to sacrifice either the weight of the device in order to make it light weight, or material compatibility with the coolant. A single design could either meet one requirement or the other but not both at the same time. The use of florinerts limits the cooling capability of the assembly. Of special concern in situations where a florinert is used are the issues of coolant containment and material compatibility since not every material can be used for florinert's containment. The use of individual cold plates implies the need of two fluid connections at which fluid can more readily leak onto the electronic components. The use of individual spreader plates has the potential problem of placing additional mechanical stresses on the module to printed circuit card connection since it would be difficult if not impossible to insure all individual spreader plate surfaces were in the appropriate plane.

Figure 1:
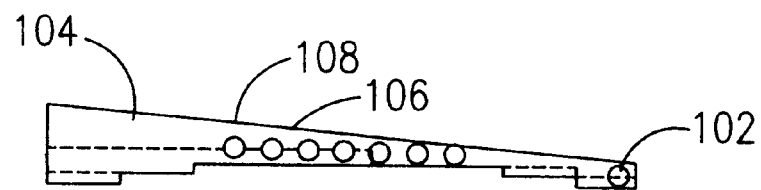
FIG. 1 is the top view illustration of one embodiment of the present invention.

The present cooling system shown in the drawing addresses many of the concerns with the prior art methods of cooling. In one embodiment of the present invention, as illustrated in FIG. 1, an aluminum plate 104 provides thermal spreading and serves as a substrate for a thin walled coolant carrying copper tubes 106. The coolant 108 is preferably water. The aluminum plate provides a rigid structure to which the board/module 102 assembly can be mechanically attached. The plate also provides for a shape transformation from the top surfaces of the modules to the copper tubing coolant passages.

In the present arrangement, heat dissipated within the electronic module passes across a module to plate's thermal interface and spreads through the aluminum plate, passes across the plate to copper tubing interface and is convected away by water flowing through the copper tubing.

In one embodiment of the present invention the aluminum plate is actually wedge shaped, with one side of it being thicker than the opposing side. This wedge shaped geometry will allow the control of heat dissipation. A thicker section of the material allows for better heat dissipation while a thinner portion of the material allows shorter access to the water or other liquid coolants. In addition the change in material thickness can also be used in ensuring a better fit in terms of geometry between the plate and the modules.

Figure 2:
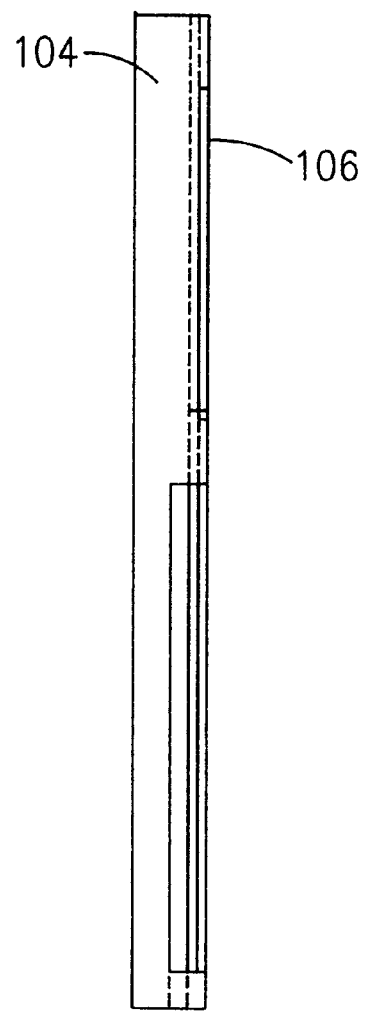
FIG. 2 is front view diagram of an system illustrating the cooling methods used in an embodiment of the present invention.

FIG. 2 is a detailed diagram of one embodiment of the present invention, illustrating a front view orientation. Numbers are used as an example to indicate spacial orientation and measurements. A left side view is provided in FIG. 1 when the assembly of FIG. 2 is rotated to provide a different orientation of the aluminum plate 104 and copper tubing 106.

Figure 3:
FIG. 3 illustrates different details of the embodiment in FIG. 1 and cut along line A—A.

FIG. 3 is an illustration of an alternative embodiment of the present invention.

Figure 5:
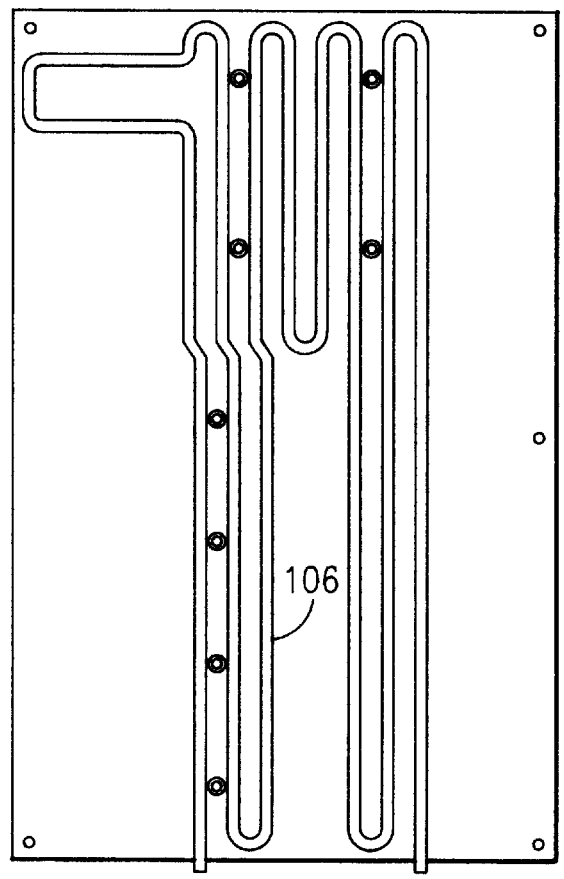
FIG. 5 is an illustration of the tube surfaces as installed on a cold plate.

Channels are machined in the back surface of the aluminum plate and copper tubing 106 formed to the desired geometry is laid in the channels and bonded to the plate as shown in FIG. 5. The opposite surface of the plate is machined to provide a matting geometry with the top cold plate and board that are mechanically, or otherwise, fastened together. Additionally, it is from this surface that material is removed where necessary to accommodate geometrical constraints dictated by the second level packaging. FIG. 5 provides a different outlook at the present invention as shown in FIG. 1. FIG. 5 illustrates one embodiment of the present invention as shown in FIG. 1 but rotated clockwise. (Copper tubing is still indicated by number 106.)

Figure 4A:
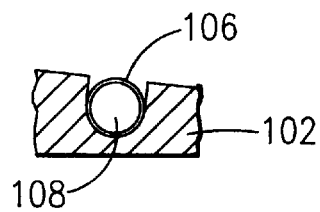
FIG. 4A is an alternate embodiment of the present invention.
Figure 4B:
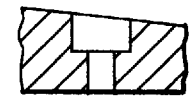
FIG. 4B illustrates different details of the embodiment shown in FIG. 2 and cut along the line C—C.

The copper tubing is bonded to the aluminum plating. FIG. 4A is a detailed view of the copper tubing and the aluminum plate as provided in FIG. 3. In FIG. 4A, the copper tubing 106 is bonded to the Aluminum plate 104 through the use of a thermal epoxy. The bonding can be also accomplished by soldering the copper tubing to the aluminum plate. The above two bonding methods, however, were only used as means of example and the bonding can be accomplished by using other commercially available techniques.

In another embodiment of the present invention, the electronic modules are mechanically attached to the aluminum plate. A threaded stud, is an integral part of the module cap, passes up through a clearance hole in the cold plate. A nut is then used to draw the thermal surfaces of the aluminum plate and the electronic module into good thermal contact. Interface materials between the aluminum plate and modules such as a flexible filled silicone pad, grease or oil are optional. The flex circuit which attaches the electronic module to the board accommodates small dimensional tolerances.

Because the cooling system of the present invention is fastened in the manner shown in the FIGS. 1–5 to the aluminum plate, the coolant will flow independent of the orientation of the device in which the modules will be installed. FIGS. 6A and 6B show an example of such a device 600. The present cooling system will be installed on the test element 610 of the device 600. Lever 612 displace the test element in the vertical direction or even rotate it 180 degrees (in a clockwise-counterclockwise direction.) No matter what the orientation of the test element or ultimately of the cooling system of the present invention 660 or the modules 650, the present cooling system will be functional and operational, an advantage which is not observed in other cooling schemes that utilize heat pipe technologies. The cooling system of the present invention, is therefore independent of its orientation.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of cooling electronic components in an electronic assembly having a plurality of modules, said assembly having a center and a periphery area, comprising the steps:

shaping a light weight plate having apertures so that said plate becomes thicker at one end and thinner on a second end;

placing a plurality of thin coolant passage tubes in said apertures of said plate, said passage tubes being of a different material than said plate;

affixing said coolant passages to said plate by means of a thermal epoxy;

placing said plate and coolant passages in thermal contact with said electronic assembly and modules;

configuring said plate and coolant passages in a manner so that said thinner side of said plate faces said center of said assembly and said thicker side is placed along said periphery area of said assembly to maximize heat dissipation of said assembly; and cooling said electronic assembly by putting said plate and passage tubes in thermal contact with said assembly after a coolant is also provided in said passages.

2. A method of cooling electronic elements and modules in an electronic assembly using a heat sink, said method comprising the steps:

forming a wedge shaped plate out of aluminum in a manner so that one end of said plate is substantially thinner than an opposing side;

providing a plurality of substantially semi-cylindrical apertures through out said plate so that said apertures are visible from a side adjacent to any of said ends of said plate;

forming a plurality of thin walled cylindrical shaped copper water passage tubes;

placing said copper coolant passage tubes in said apertures of said plate;

affixing said copper coolant passage tubes to said aluminum plate by use of thermal epoxy;

shaping said copper coolant passage tubes so any areas exposed visibly become flushed with said surface of said aluminum plate;

affixing said plate assembly to said electronic assembly in a manner so that said coolant assembly becomes independent and can function in any orientation that said electronic assembly may be placed in; and cooling said electronic assembly by placing said plate and passages in thermal contact with said assembly after water is introduced as a coolant into said passage tubes.

3. The method of claim 2, further comprising the step of providing an interface material between said plate and said modules.

4. The method of claim 2, wherein said interface material is a filled silicone pad.

5. The method of claim 4, wherein said interface material is grease.

6. The method of claim 4, wherein said interface material is an oil.

* * * * *